United States Patent [19]

Saito

[11] Patent Number: 5,279,704
[45] Date of Patent: Jan. 18, 1994

[54] METHOD OF FABRICATING SEMICONDUCTOR DEVICE

[75] Inventor: Yoshimitsu Saito, Saitama, Japan

[73] Assignee: Honda Giken Kogyo Kabushiki Kaisha, Tokyo, Japan

[21] Appl. No.: 872,080

[22] Filed: Apr. 22, 1992

[30] Foreign Application Priority Data

Apr. 23, 1991 [JP] Japan .................... 3-119512
Apr. 23, 1991 [JP] Japan .................... 3-119514

[51] Int. Cl.$^5$ ............................ H01L 21/00
[52] U.S. Cl. .................. 156/640; 156/662; 134/33; 134/902; 252/79.1
[58] Field of Search ........... 156/640, 639, 662; 252/79.1; 134/153, 33, 902

[56] References Cited

U.S. PATENT DOCUMENTS

| | | |
|---|---|---|
| 3,936,855 | 2/1976 | Goell et al. |
| 3,972,770 | 8/1976 | Stein |
| 4,027,686 | 6/1977 | Shortes et al. .......... 134/33 |
| 4,544,446 | 10/1985 | Cady .................. 156/639 |
| 4,732,785 | 3/1988 | Brewer .............. 437/231 X |
| 4,856,456 | 8/1989 | Hillman et al. .......... 118/500 |
| 4,871,417 | 10/1989 | Nishizawa et al. ........ 156/640 |
| 5,032,217 | 7/1991 | Tanaka ................. 156/640 |
| 5,122,481 | 6/1992 | Nishiguchi ............ 156/625 X |

FOREIGN PATENT DOCUMENTS

| | | |
|---|---|---|
| 54-32968 | 3/1979 | Japan . |
| 56-147439 | 11/1981 | Japan . |
| 59-18642 | 1/1984 | Japan . |
| 61-153537 | 7/1986 | Japan . |
| 63-62235 | 3/1988 | Japan . |
| 1-25539 | 1/1989 | Japan . |
| 2-30132 | 1/1990 | Japan . |
| 2231719 | 11/1990 | United Kingdom . |

OTHER PUBLICATIONS

J. J. LePore, "An Improved Technique for Selective Etching of GaAs and Ga$_{1-x}$Al$_x$As", J. Appl. Phys., pp. 6441–6442, vol. 51, No. 12, Dec. 1980.

Hok et al., "Batch Fabrication of Micromechanical Elements in GaAs-Al$_x$Ga$_{1-x}$As", Sensors and Actuators, pp. 341–348, vol. 4, 1983.

Howes et al., Gallium Arsenide, , pp. 124–127, published by John Wiley & Sons, 1985.

Sakuta et al., "The Selective Chemical Etching Technique to Isolate Al$_x$Ga$_{1-x}$As Layers from GaAs Layers", The Technical Reports on the Meeting of Technical Group on Semiconductors & Semiconductor Devices, pp. 9–17, Feb. 25, 1974.

Kelly Kenefick, "Selective Etching Characteristics of Peroxide/Ammonium-Hydroxide Solutions for GaAs-/Al$_{0.16}$Ga$_{0.84}$As", J. Electrochem. Soc.: Solid-State Science and Technology, pp. 2380–2382, vol. 129, No. 10, Oct. 1982.

Primary Examiner—Thi Dang
Attorney, Agent, or Firm—Merchant, Gould, Smith, Edell, Welter & Schmidt

[57] ABSTRACT

A wafer comprising a GaAs substrate and an AlGaAs layer deposited thereon is rotated in a spin etching process. To the GaAs substrate of the rotating wafer, there is supplied an ammoniacal etching solution for selectively etching the GaAs substrate to form a groove therein. The ammoniacal etching solution comprises a mixture of hydrogen peroxide and aqueous ammonia, the volume ratio of hydrogen peroxide and aqueous ammonia being in the range from about 20 to 60. While the GaAs substrate is being selectively etched by the ammoniacal solution, the rotational speed of the wafer is progressively increased stepwise or continuously. The etching solution whose volume ratio of hydrogen peroxide and aqueous ammonia is in the range from about 20 to 60 is suitable for the formation of a deep groove in the GaAs substrate. The rotational speed of the GaAs substrate is progressively increased stepwise or continuously to progressively increase centrifugal forces applied to the GaAs substrate for thereby expelling a substance, which is generated in reaction with the etching solution, off the GaAs substrate. Since such a substance is prevented from being deposited on the GaAs substrate, the etching process progresses uniformly without an etching failure.

7 Claims, 3 Drawing Sheets

METHOD OF FABRICATING SEMICONDUCTOR DEVICE

BACKGROUND OF THE INVENTION

1. Field of the Invention

The present invention relates to a method of fabricating a semiconductor device having an AlGaAs layer and a GaAs layer which are successively deposited on a GaAs substrate, the AlGaAs layer being used as an etching stopper layer to allow a deep groove to be etched in the GaAs layer.

2. Description of the Relevant Art

It is known from Japanese laid-open patent publication No. 61-153537, for example, that the drain current of a field-effect transistor which comprises a piezoelectric semiconductor such as GaAs varies when a stress is applied to the field-effect transistor. There have been developed and put to use semiconductor sensors for detecting external forces such as pressures or accelerations based on such property of field-effect transistors. Those semiconductor sensors include cantilever- and diaphragm-type semiconductor sensors for higher detection sensitivity.

One conventional cantilever-type semiconductor sensor has an AlGaAs layer, a GaAs buffer layer, and a GaAs active layer which are successively deposited on a GaAs layer. A substantially central region of the GaAs substrate is etched away to form a thin flexible region where a field-effect transistor is disposed.

The GaAs substrate is etched according to a spin etching process in which an ammoniacal etching solution is supplied to the GaAs substrate while it is rotating.

The spin etching process is suitable for etching a semiconductor substrate such as a GaAs substrate to a small depth that is about several microns.

However, if the GaAs substrate is to be partly etched by the spin etching process to form a relatively deep groove which may be 500 microns deep, then the following problem occurs:

When the GaAs substrate is etched while it is rotating at a relatively low speed of 200 rpm or lower, for example, the etching solution tends to remain in the groove as the depth of the groove becomes larger. Therefore, a substance such as of a gallium oxide is generated in reaction with the etching solution and deposited in the corners of the groove, and the deposit prevents the GaAs substrate from being further etched.

Etching the GaAs substrate to form a deep groove requires an etching solution having a high etch rate to be used for a shortened etching time. However, the higher the etch rate, the greater the amount of a substance generated in reaction with the etching solution per unit period of time. The generated substance forms a deposit in the groove, resulting in an etching failure.

The relationship between rotational speeds of the semiconductor substrate and yields was experimentally assessed, and the results of the experiment are shown in Table 1 below. In the experiment, hydrogen peroxide containing aqueous ammonia was used as an etching solution. The yields are indicated by the percentage of acceptable cantilever-type semiconductor sensors (FIG. 1) of desired configuration each having a thin flexible region formed by partly etching away a GaAs substrate.

TABLE 1

| Rotational speed (rpm) | Yield (%) |
|---|---|
| 60 | 2 |
| 200 | 5 |
| 300 | 12 |
| 500 | 20 |

As the rotational speed of the semiconductor substrate increases, the yield also increases. However, no sufficient yield can be achieved because the yield is only 20% at the rotational speed of 500 rpm. The yield is low for the reason that as the rotational speed of the semiconductor substrate increases, the etching solution tends to flow as a localized flow.

Japanese laid-open patent publication No. 63-62235 discloses a method of selectively etching a GaAs substrate or a GaAs layer with an AlGaAs layer used as an etching stopper. According to the disclosed etching method, an aqueous solution of a mixture of 28% by weight of aqueous ammonia ($NH_4OH$) and 30% by weight of hydrogen peroxide ($H_2O_2$) at a mixture ratio ranging from 1:750 to 1:1500 is used as an etching solution.

With the mixture ratio between aqueous ammonia and hydrogen peroxide ranging from 1:750 to 1:1500, however, the etching speed is low and it is time-consuming to selectively etch the GaAs substrate or layer to a large depth.

SUMMARY OF THE INVENTION

It is an object of the present invention to provide a method of fabricating, with a high yield, a semiconductor device having a semiconductor substrate or layer etched to form a deep groove.

Another object of the present invention is to provide a method of fabricating a semiconductor device by selectively etching, at a high etching speed, a wafer composed of an AlGaAs layer deposited on a GaAs substrate, on the reverse side of the GaAs substrate, to form a deep groove highly accurately in the GaAs substrate with a high yield.

According to the present invention, there is provided a method of fabricating a semiconductor device, comprising the steps of rotating a semiconductor substrate, supplying an etching solution to the semiconductor substrate to etch the semiconductor substrate or a semiconductor layer disposed thereon for thereby forming a groove therein, and progressively increasing the rotational speed of the semiconductor substrate while the semiconductor substrate or the semiconductor layer is being etched by the etching solution.

According to the present invention, there is also provided a method of fabricating a semiconductor device, comprising the steps of rotating a wafer comprising a GaAs substrate and an AlGaAs layer deposited thereon, supplying an ammoniacal etching solution to the GaAs substrate for selectively etching the GaAs substrate to form a groove therein, the ammoniacal etching solution comprising a mixture of hydrogen peroxide and aqueous ammonia, the volume ratio of hydrogen peroxide and aqueous ammonia being in the range from about 20 to 60, and progressively increasing the rotational speed of the wafer while the GaAs substrate is being selectively etched by the ammoniacal solution.

The etching solution whose volume ratio of hydrogen peroxide and aqueous ammonia is in the range from about 20 to 60 is suitable for the formation of a deep groove in the GaAs substrate. The rotational speed of the GaAs substrate is progressively increased stepwise or continuously to progressively increase centrifugal forces applied to the GaAs substrate for thereby expelling a substance, which is generated in reaction with the etching solution, off the GaAs substrate. Since such a substance is prevented from being deposited on the GaAs substrate, the etching process progresses uniformly without an etching failure.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
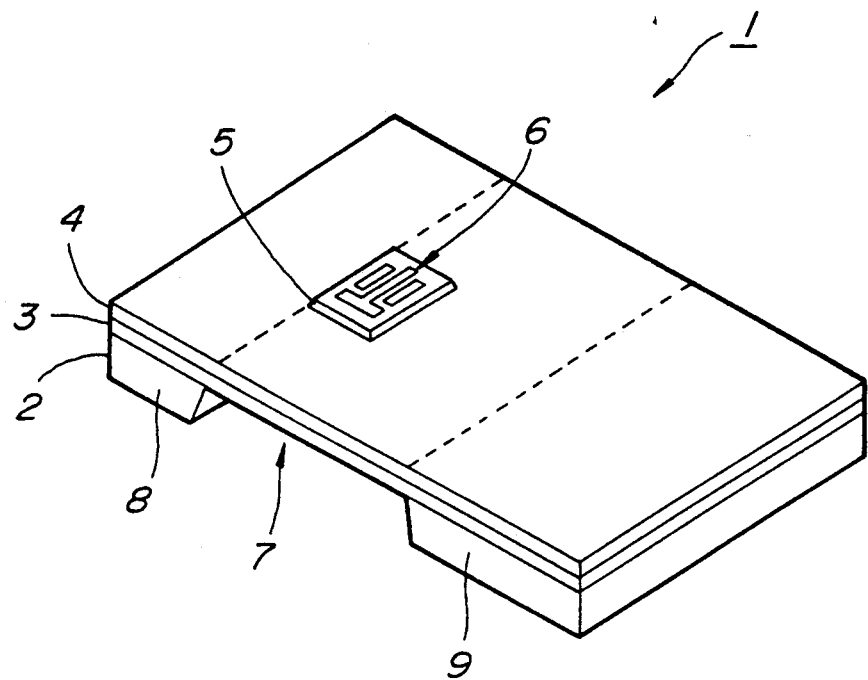
FIG. 1 is a perspective view of a cantilever-type semiconductor sensor.

FIG. 1 shows the structure of cantilever-type semiconductor sensor.

The cantilever-type semiconductor sensor, generally designated by the reference numeral 1 in FIG. 1, is fabricated as follows:

An AlGaAs layer 3, a GaAs buffer layer 4, and a GaAs active layer 5 are successively deposited on a GaAs layer 2. Then, a field-effect transistor 6 is formed on the GaAs active layer 5. A substantially central region of the GaAs substrate 2 is etched away from the reverse side of the semiconductor sensor. The field-effect transistor 6 is positioned in a thin flexible region 7 where the GaAs substrate 2 is etched away. One end of the GaAs substrate 2 which is located on one side of the thin flexible region 7 serves as a fixed region 8, whereas the other end on the other side of the thin flexible region 7 serves as a weight region 9. In this manner, the cantilever-type semiconductor sensor 1 is fabricated.

The GaAs substrate 2 is etched according to a spin etching process in which an ammoniacal etching solution is supplied to the GaAs substrate 2 while it is rotating.

Figure 2:
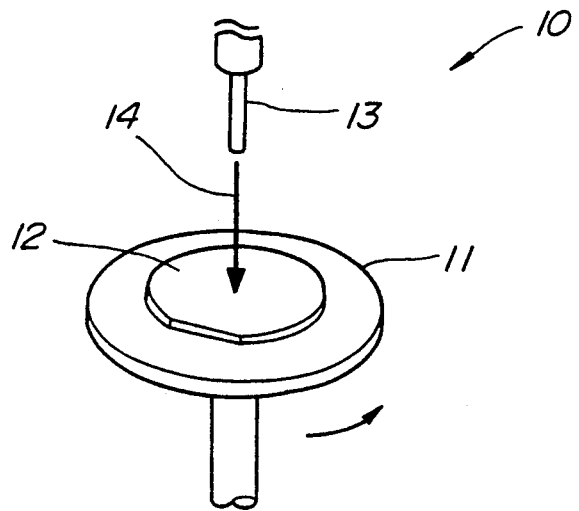
FIG. 2 is a perspective view illustrative of a spin etching process.

More specifically, as shown in FIG. 2, a semiconductor substrate such as a GaAs substrate 12 coated with a resist is horizontally placed on and fixed to a turntable 11 of a spin etching device 10. While the semiconductor substrate 12 is rotating, an etching solution 14 is supplied from a nozzle 13 disposed above the semiconductor substrate 12, to drop onto a substantially central area of the semiconductor substrate 12. The semiconductor substrate 12 is etched by the etching solution 12 as it is uniformly scattered over the semiconductor substrate 12 under centrifugal forces.

For selectively etching only a GaAs substrate on which an AlGaAs layer is deposited, an etching solution comprising a mixture of aqueous ammonia and hydrogen peroxide is applied to the GaAs substrate.

Figure 3:
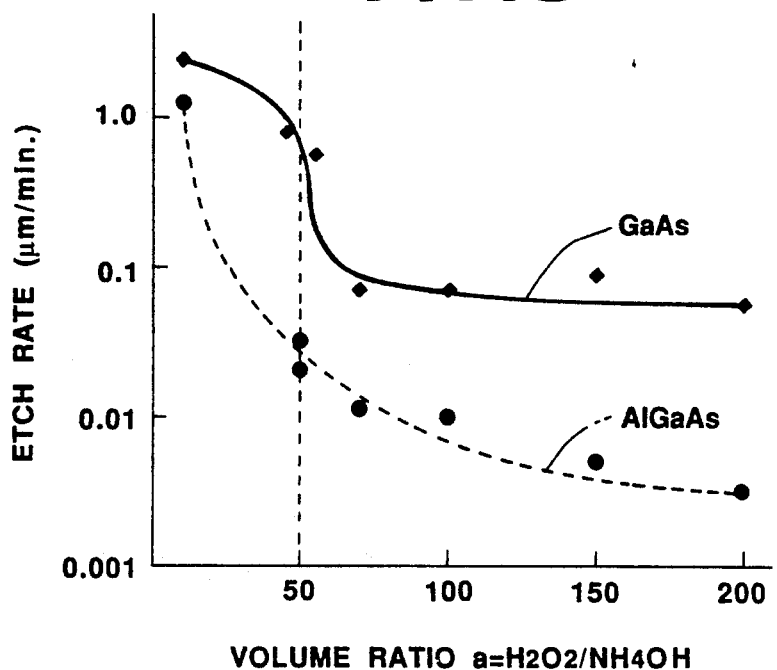
FIG. 3 is a graph showing the relationship between the volume ratios of hydrogen peroxide to aqueous ammonia and etch rates of GaAs and AlGaAs.

FIG. 3 shows various etch rates of GaAs and AlGaAs measured with respect to different volume ratios of hydrogen peroxide to aqueous ammonia of such an etching solution. The mixture ratio X of Al in $Al_xGa_{1-x}As$ was 0.3, and the etching solutions used were composed of 30% by weight of hydrogen peroxide and 29% by weight of aqueous ammonia, with the volume ratio a being defined as:

$$a = H_2O_2/NH_4OH.$$

The vertical axis of the graph of FIG. 3 represents etch rates ($\mu$m/minute) on a logarithmic scale, and the horizontal axis represents volume ratios a. The characteristic curve indicated by the solid line shows etch rates of GaAs, and the characteristic curve indicated by the dotted line shows etch rates of AlGaAs. When etching solutions whose volume ratio a is smaller than 10 is employed, the difference between the etch rates of GaAs and AlGaAs is small.

As the volume ratio a increases, i.e., as the amount of hydrogen peroxide increases compared with the amount of aqueous ammonia, the etch rate of AlGaAs decreases. The etch rate of GaAs sharply drops with the volume ratio a in the range of from 50 to 60.

A selection ratio S is defined as follows:

S = GaAs etch rate/AlGaAs etch rate.

Figure 4:
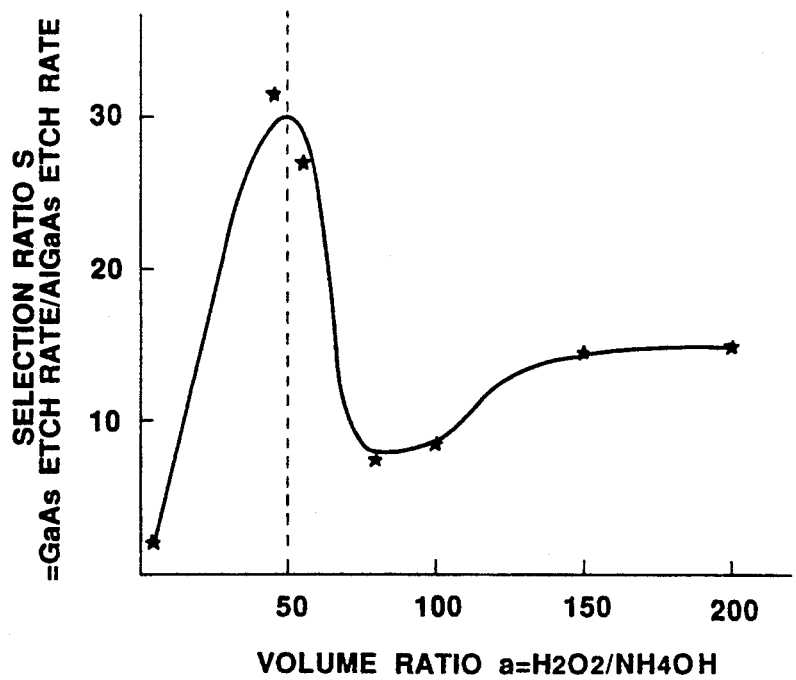
FIG. 4 is a graph showing the relationship between the volume ratios of hydrogen peroxide to aqueous ammonia and selection ratios.

FIG. 4 shows the dependency of the selection ratio S upon the volume ratio a of the etching solution, as plotted based on the measured data shown in FIG. 3. The selection ratio S represents how many times the GaAs etch rate is larger than the AlGaAs etch rate.

It can be seen from FIG. 4 that the selection ratio S is of a maximum value of 30 when the volume ratio a of hydrogen peroxide to aqueous ammonia is about 50.

The etching characteristics shown in FIGS. 3 and 4 indicate that the etching solutions whose volume ratio a ranges from about 20 to 60 is suitable for use in a fabrication process for forming a deep groove in a GaAs substrate.

The mixture ratio X of Al was 0.3 in AlGaAs used to produce the measured data of FIG. 4. However, even when the proportion of Al increases or decreases, the selection ratio S is maximum with the volume ratio a = 50, and the etching solution whose volume ratio a ranges from about 20 to 60 remains suitable for forming a deep groove in a GaAs substrate.

An AlGaAs layer is deposited on a GaAs substrate by a known epitaxial growth process, thus producing a wafer. Then, an $SiO_2$ film is deposited on the reverse side of the wafer according to a chemical vapor deposition (CVD) process, after which a resist pattern is formed on the $SiO_2$ film. The $SiO_2$ film is patterned to a desired shape based on the resist pattern according to an HF process. Then, using the spin etching device shown in FIG. 2, a deep groove is formed in the GaAs substrate of the wafer with the etching solution whose volume ratio a has been selected in the range described above.

The rotational speed of the turntable 11 (FIG. 2) which supports the wafer thus produced is progressively increased stepwise from 200 rpm while the GaAs substrate is being etched.

Figure 5:
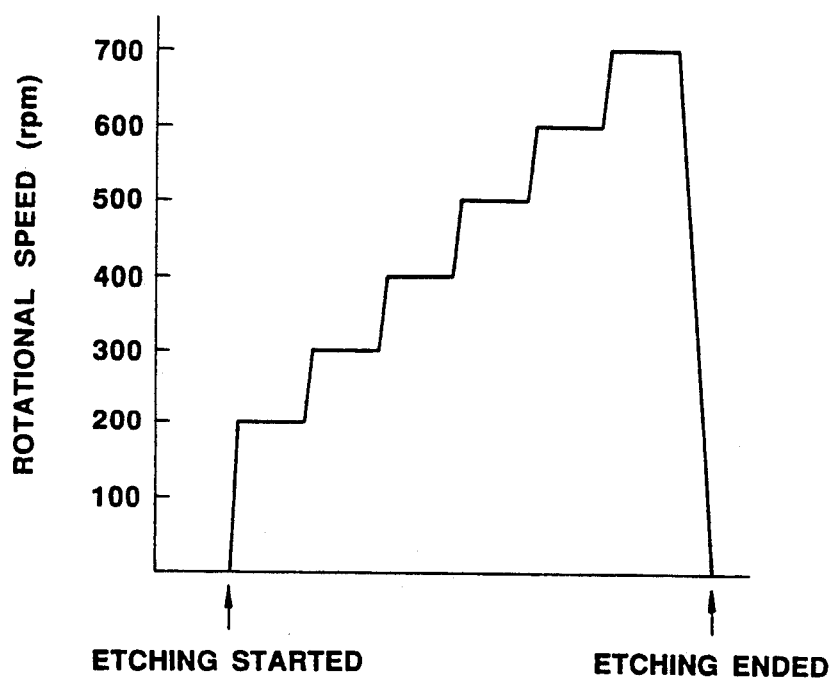
FIG. 5 is a graph showing varying rotational speeds of a semiconductor substrate.

FIG. 5 shows the manner in which the rotational speed of the turntable 11 and hence the GaAs substrate supported thereon is progressively increased stepwise as the spin etching process progresses. In an initial low rotational speed range of about 200 rpm, the groove formed in the GaAs substrate is shallow, and the applied etching solution is uniformly scattered over the substrate surface. Therefore, the etched surface of the GaAs substrate is relatively flat and uniform.

As the groove formed in the etching process becomes deeper, a substance generated in reaction between GaAs and the etching solution is deposited on slanted surfaces across directions in which centrifugal forces are applied. If the deposits remained on the substrate, the etched surface would become irregular, and the yield of semiconductor devices would be lowered.

According to the present invention, the rotational speed of the GaAs substrate is progressively increased stepwise to progressively increase the centrifugal forces applied to the GaAs substrate for thereby expelling the deposited substance off the GaAs substrate. Therefore, a substance which is generated in reaction with the etching solution as the etching process progresses is prevented from being deposited on the GaAs substrate, allowing the etching process to progress uniformly without an etching failure.

Table 2 below shows different yields of semiconductor devices with two different rotational speed patterns. In one rotational speed pattern, the rotational speed is increased through three steps. In the other rotational speed pattern, the rotational speed is increased through six steps.

TABLE 2

| Rotational speed pattern (rpm) | Yield (%) |
|---|---|
| 200 → 300 → 500 | 40 |
| 200 → 300 → 400 → 500 → 600 → 700 | 90 |

As can be seen from Table 2, when the GaAS substrate is etched while the rotational speed is increased stepwise from 200 rpm 300 rpm to 500 rpm, the yield is about 40%, and when the GaAS substrate is etched while the rotational speed is increased stepwise in increments of 100 rpm from 200 rpm to 700 rpm, the yield is about 90%.

The rotational speed increment and the time when the rotational speed is increased may be selected depending on the width and depth of a groove to be formed by etching the semiconductor substrate.

As described above, the volume ratio a of hydrogen peroxide to aqueous ammonia of the etching solution is selected to be in a desirable range and the rotational speed of the semiconductor substrate is progressively increased stepwise in the etching process. According to such a process, semiconductor substrates with deep grooves defined therein by etching can be fabricated with high reproducibility, uniformity, yield, and within short etching time.

The rotational speed of the semiconductor substrate may be increased continuously rather than stepwise.

The process can be applied to manufacture, in short time with high yield, cantilever- or diaphragm-type semiconductor sensors for detecting a physical quantity such as pressure, acceleration, or the like.

In the case where a semiconductor substrate or a semiconductor layer deposited on such a semiconductor substrate is etched to form a deep groove therein at a high etch rate in a short period of time, the amount of substance produced in reaction with the etching solution per unit period of time is increased, and the produced substance in the groove becomes less liable to be expelled off as the groove becomes deeper. However, even if an etching solution for a high etch rate is used, the semiconductor substrate or layer can be etched with a good yield by increasing the rotational speed of the semiconductor substrate or layer in spin etching as the etching process progresses.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

I claim:

1. A method of fabricating a semiconductor device, comprising the steps of:

rotating a wafer comprising a GaAs substrate and an AlGaAs layer deposited thereon;

supplying an ammoniacal etching solution to the GaAs substrate for selectively etching the GaAs substrate to form a groove therein, said ammoniacal etching solution comprising a mixture of hydrogen peroxide and aqueous ammonia, the volume ratio of hydrogen peroxide and aqueous ammonia being in the range from about 20 to 60; and progressively increasing the rotational speed of the wafer while the GaAs substrate is being selectively etched by said ammoniacal solution.

2. A method according to claim 1, wherein said rotational speed of the wafer is increased stepwise.

3. A method according to claim 1, wherein said rotational speed of the wafer is increased continuously.

4. A method of fabricating a semiconductor device, comprising the steps of:

rotating a semiconductor substrate;

supplying an etching solution to the semiconductor substrate to etch the semiconductor substrate or a semiconductor layer disposed thereon for thereby forming a groove therein; and progressively increasing the rotational speed of the semiconductor substrate while the semiconductor substrate or the semiconductor layer is being etched by the etching solution.

5. A method according to claim 4, wherein said rotational speed of the semiconductor substrate is increased stepwise.

6. A method according to claim 4, wherein said rotational speed of the semiconductor substrate is increased continuously.

7. A method according to claim 4, wherein said etching solution comprises a mixture of hydrogen peroxide and aqueous ammonia, the volume ratio of hydrogen peroxide and aqueous ammonia being in the range from about 20 to 60.